United States Patent [19]

Crooke et al.

[11] Patent Number: 4,578,640

[45] Date of Patent: Mar. 25, 1986

[54] OSCILLOSCOPE CONTROL

[75] Inventors: Arthur W. Crooke, Concord; Colin Gyles, Boxford; Edwin E. Stebbins, Boston, all of Mass.

[73] Assignee: Analogic Corporation, Peabody, Mass.

[21] Appl. No.: 418,187

[22] Filed: Sep. 14, 1982

[51] Int. Cl.[4] .................................... G01R 13/20
[52] U.S. Cl. ................................ 324/115; 324/121 R; 340/722; 340/731
[58] Field of Search .................... 324/115, 121 R; 340/721, 731, 712, 722, 734, 753, 754

[56] References Cited

U.S. PATENT DOCUMENTS

| | | | |
|---|---|---|---|
| 4,104,725 | 8/1978 | Rose et al. | 324/121 R |
| 4,204,204 | 5/1980 | Pitstick | 340/753 |
| 4,295,135 | 10/1981 | Sukonick | 340/753 |
| 4,386,347 | 5/1983 | Cutler et al. | 340/712 |

OTHER PUBLICATIONS

1971 Tektronix Catalogue, pp. 29, 30, 45.

Primary Examiner—Ernest F. Karlsen
Assistant Examiner—Kevin D. O'Shea
Attorney, Agent, or Firm—Robert K. Tendler

[57] ABSTRACT

An oscilloscope having multiple controls, wherein control functions are selected from a plurality of functions. Controls are located adjacent to the oscilloscope display which indicate the control parameter label and control parameter values. The control parameter selection is implemented by software program control.

13 Claims, 2 Drawing Figures

OSCILLOSCOPE CONTROL

FIELD OF THE INVENTION

The present invention relates to oscilloscopes and more particularly to oscilloscopes incorporating controls having visual indication of control functions.

BACKGROUND OF THE INVENTION

Oscilloscopes include large numbers of functions which in themselves have an increasing number of parameters to be controlled. These oscilloscopes require the operators to become increasingly intimate with those functions through the operational controls. The half dozen controls such as X, Y and Z axis of early oscilloscopes has increased to forty to fifty with the present day oscilloscopes. It is therefor likely that future oscilloscopes will require another order of magnitude of control parameters. However, as the number of controls increases, the instrument appears increasingly complex to the user which decreases its effectiveness. Although the users tolerance for complexity has increased with the availability of complex instruments, it saturates at a level which is dependent on his motivation, which is in turn dependent on the complexity of the problem to be solved and his need to solve it. Therefore, the complexity of many instruments, including oscilloscopes, have now approached or surpassed the saturation level of the tolerance of most users. It is necessary to develop methods to reduce this perceived complexity to below that threshold.

The typical solution to complex instruments involves the use of a control panel with a multiplicity of fixed functions where each function has a single control. However, as the number of controls becomes large, it is not possible to observe the state of the instrument by observing the control setting, inasmuch as it is difficult to find the control itself. Similarly, adjustment is difficult since it is necessary to both find and adjust a particular control from a field of controls. Also, as the complexity or flexibility of the oscilloscope increases further, such as for additional channels, the number of controls is multiplied, making adjustment and interpretation of the oscilloscope display increasingly difficult.

One solution to this problem is to bypass the problem by trading off flexibility for operational simplicity, such as by restricting the flexibility of the instrument. A second trade-off could be made by restricting the user rather than the application. In this manner, the complex instruments could only be made available to people having complex operating systems, such as mini or microcomputer systems. The user of this system must then be a technician or programmer familiar with the function of each of the instruments, the computers and their communication protocols. A disadvantage of this approach is that the important parameters become embedded within the controlling system and are accessible only by tedious system inspections. Furthermore, system checkout becomes difficult when intermediate results cannot be examined, and the system is awkward and expensive.

Another technique which has been used in some logic analyzers and automatic test equipment is the use of a directed sequence of menus. The menu often requires the dedicated use of the old display device during the set-up or initialization process. In these applications, the system set-up is normally complex enough to require prompting by the instrument, and is done only once for large number of measurements. Control settings are not seen while viewing measurement results. However, for an analyzing instrument, the menu technique is undesirable since the controls are not interactive by the user while viewing the system measurement results. For example, the vertical gain of an oscilloscope is usually adjusted to get the waveform to fill a particular portion of the screen rather than to set the gain to a particular vertical scale factor in volts per centimeter which would allow direct user signal interpretation without reviewing the selected menu scale value. It is therefore necessary to devise an instrument which will reduce the complexity to the user while not reducing its convenience, flexibility or capability.

BRIEF DESCRIPTION OF THE INVENTION

The present invention incorporates the use of software controlled, dynamically-defined and labelled "soft" keys and controls to reduce the oscilloscope complexity. Through a selection of a process, such as one incorporating a software or programmable operation, one set of keys can be used to control a variety of sets of parameters. The current functional definition of the keys is user-controlled by another group of keys. Moreover, for each parameter, the step size and range can be varied, ensuring optimum user convenience. Also, similar controls may be coupled for simultaneous adjustment most of the time and can be disconnected when required for maximum oscilloscope flexibility.

The operation of the oscilloscope by soft keys may be directed by a predetermined sequence which aids the novice user by suggesting a sequence of parameter adjustments of the instrument and labelling each key with the corresponding parameter and parameter value. Once the sequence becomes familiar to the user, he may randomly access and adjust only selected parameters. Also, several parameters can be controlled by a single adjustment, and processor algorithm may be used which makes predefined assumptions about what the user wants for the current adjustment state of the instrument and provides those settings. The user can also record and save frequently used instrument parameter values for later recall and readjustment. The complete instrument adjustment can then be rapidly restored from the predefined parameter settings. The instrument can also be tailored by a sophisticated user for use by a non-sophisticated user for a specific task, such as production line testing. Here the contol specialization is made by the user, rather than the designer or the manufacturer of the oscilloscope.

The oscilloscope according to the present invention comprises a front panel display screen for presentation of the signal waveforms and a panel below the screen containing a plurality of pushbuttons, each of which performs the function of a switch, or when grouped together in sets of pushbuttons, emulates the function of a rotary or toggle switch. Moreover, the push button bay be replaced by rotary or toggle switches. The controlled function and respective parameter value are indicated on the adjacent display area together with the waveform. In an array set of four, the top two buttons are used for slewing the indicated parameter up or down at a slow rate. The lower pair in each set is used for fast slewing in each direction. Elsewhere on the oscilloscope structure or main frame, parameter control selectors are located. Additional control selectors may be incorporated as part of a plug-in unit within the main frame. The parameter control selector allows the user to select the particular set of parameters to be controlled by the control panel pushbuttons and be indicated on the display means.

In addition, the oscilloscope also comprises a process control means which is responsive to the parameter control selector operation. The process control means receives the external signal to be measured, of which a representative signal sample or processed result, or both is sent to the oscilloscope display. The process control means adjusts the display parameters according to signals from the control panel keys located adjacent to the display means. In addition, the process control means may incorporate a signal storage element to store a representative sample of the received signal and processed results for later replay. The process control means may include circuitry or software to provide a plurality of individual processes, according to the particular process selected by the user. Moreover, a removeable storage element, such as magnetic disc or tape, may be attached to the process control means to store the signal representation, the selected process and other information such as the particular control panel setting and alpha-numeric identification codes and signal values.

BRIEF DESCRIPTION OF THE DRAWING

These and other features of the present invention can be better understood by reading the detailed description along with the drawing, wherein.

DETAILED DESCRIPTION OF THE INVENTION

Figure 1:
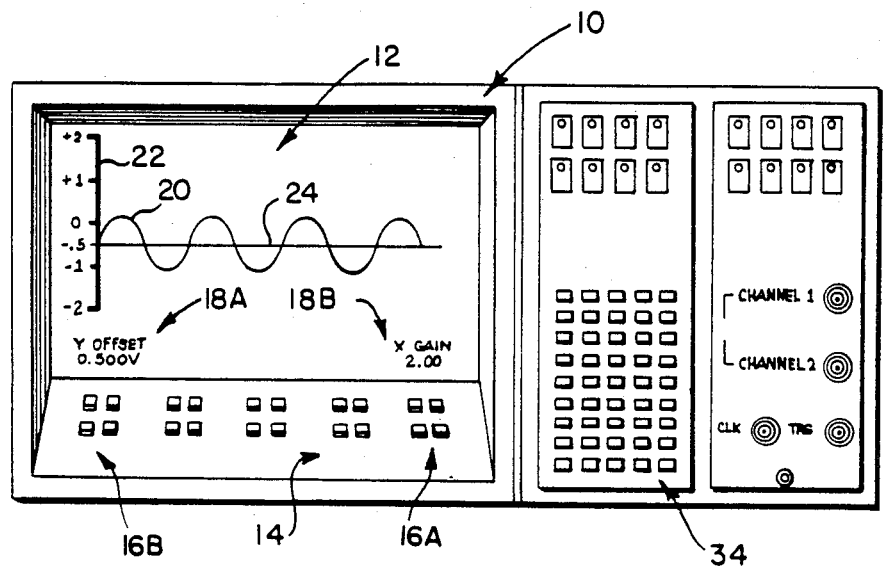
FIG. 1 is a view of the front panel of the oscilloscope showing the relative position of the control panel and the display.

The relationship of the control panel to the visual display of the oscilloscope is shown in FIG. 1. The display 12 is located adjacent to the control panel 14 on oscilloscope front panel 10 with the control panel controls are grouped into a number of groups, of which two groups are labeled 16A and 16B. A larger number of groups may be included as desired. An example of one set of parameters adjusted by the control groups and the respective parameter values are illustrated on the display 12 at locations 18A and 18B. The identification locations 18A and 18B occupy a small portion of the display 12 area, adjacent to the control group 16A and 16B, allowing the remainder to be useable to display the particular waveform 20 and labelled coordinates 22 and 24 to be displayed.

The example shown in FIG. 1, illustrates the labelling of software parameters on the control panel 14 as they would appear after activating the panel selector button and the panel selector buttons 34. The pushbuttons are typically grouped in sets of four, for example the two sets 16A and 16B being shown. The first group 16A typically corresponds to the Y axis adjustment or the Y offset adjustment. The right pair in the group 16A will decrement or lower the Y offset value and the left pair will raise or increment upward the Y offset value. The upper pair will increment in a fine or slow manner and the lower pair will accomplish the adjacent in a coarse or rapid manner. The identification information shown at 18A includes the alpha-numeric label Y OFFSET and the parameter value of −0.500, corresponding to the Y axis offset of 0.5 volts. This can be seen in the curve 20 being a sinewave offset by a value of 0.5 volts along the axis 22. Similarly, the control panel button grouping 16B typically corresponds to the parameter Y gain wherein the right pair of pushbuttons in the group 16B will decrease or decrement the Y axis gain and the left pair within the group 16B will increment the Y gain. As earlier mentioned with reference to group 16A, the upper pair of group 16B will provide a fine or slower adjustment while the lower pair will provide a coarser or more rapid adjustment. The corresponding identification signal displayed on the display 12 appears in area 18B having an alphanumeric indicator Y GAIN and the corresponding parameter value of 2.00. The present system also labels the axis 22 having a maximum amplitude value of +2 and −2 labelled thereon. Additional functional button groupings may be interspersed between groups 16A and 16B as shown in FIG. 1, or elsewhere along the periphery of the display 12, as desired. According to the present invention, the respective identification information will always reside on the display screen in the area immediately above (according to FIG. 1) or in the area adjacent to the respective control panel groupings.

Figure 2:
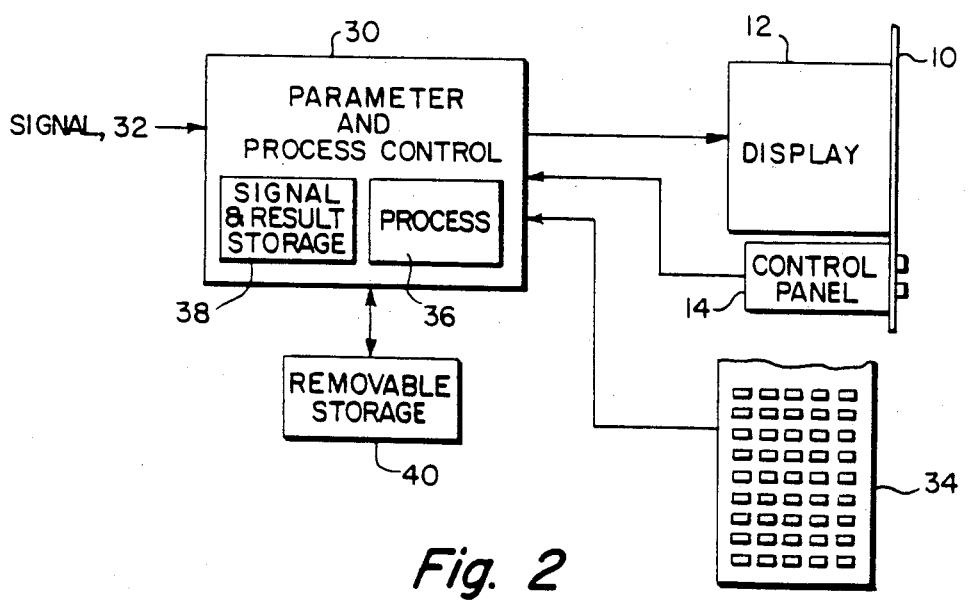
FIG. 2 is a block diagram of the oscilloscope.

The oscilloscope block diagram is shown in FIG. 2. The above-mentioned display 12 and control panel 14 are mounted on the oscilloscope front panel 10, as discussed above. The signals derived and provided to the respective elements 12 and 14 originate with a process control 30 which receives an external signal input 32 to be displayed on the display 12. The process control 30 includes apparatus to adjust the standard signal parameters such as amplitude, time base and coordinate positioning. The parameter adjustments of the selected process are provided according to user operation of the control panel 14. Alternately, other parameters or processes on the signal 32 may be selected for adjustment by buttons on panel 14 according to operation of the parameter control selector 34 by the oscilloscope user. The parameter and process control 30 also includes apparatus to provide a higher level processing of the signal 32 before being displayed on display 12. An example of this process is to integrate, differentiate or provide a Fourier transform of that signal. This process apparatus 36 typically includes a computer within the processing apparatus which is programmed appropriately to provide the selected signal process. Additionally, the parameter and process control 30 may also incorporate a signal storage element 38 which stores a representation of the signal 32 and processed modification of it to be replayed at a later time, or under a different control. A removeable storage element 40 is connected to the parameter and process control 30 to receive the representation of the signal stored and provide a selection of various processes to the signal storage element and the process element 38 and 36, respectively. Moreover, the removeable storage can also retain the current panel parameter selection and the process selection including the present one, along with the appropriate corresponding identification signals displayed on the display 12.

According to the preferred embodiment of the present invention, the signal 32 is digitized within the parameter and process control 30. The signal storage element 38, process element 36, removeable storage element 40, control panel 14 and parameter control selector 34 are then implemented according to digital processing techniques known in the art, not described here. The parameter and process control 30 also includes circuitry to provide the appropriate alpha-numeric indication on the display 12 to be juxtaposed relative to the control panel 14 and the particular control groupings thereon so as to provide a label for the information controlled by the panel 14 and the particular value of that parameter. The particular implementation in digital hardware of alpha-numeric displays is known in the art and not discussed here. Moreover, although the preferred embodiment of the present invention is implemented with a digitized signal to be measured, and displayed all or part of the present invention may as well be implemented with analog and/or mechanical structures, as appropriate, and such alternate implementation is within the scope of the present invention.

The control panel buttons may be operated in a variety of modes. For instance, there may be an immediate execution on all switch groupings to execute a single state parameter. Alternately, pressing any one of four buttons within a group may toggle or change a parameter to another state. This is used typically to select among various signal sources and/or functions and/or processes. The buttons as discussed above will step the parameter up or down in value according to a predetermined increment size as thru a list of processing options. The buttons may be operated in a manner to vernier adjust a parameter in steps or at rates smaller than that selected above. The buttons may also be operated in a manner to select a preset value by operating two buttons together. For instance, when adjusting the offset value on the screen, the trace may be centered by pressing any two buttons on a diagonal within the group, or the trace may be right or left justified by pressing the left or right pair, respectively. In addition, the controls may be coupled for simultaneous adjustment for various signals, as in the case of adjusting the amplitude and/or offset for a display of multiple signal traces, and more than one button may affect a parameter selection or value.

Alternately, when the control panel is used to adjust a function or process performed by the parameter and process control 30, the particular process parameters such as the frequency interval on a Fast Fourier Transform (FFT) may be adjusted by operation of one of the control panel 14 controls. Also, if the process requires a continuous processing of signals and display thereof, or real time processing, the keyboard control may initialize, initiate and/or stop the signal or process. Also, the controls may be used to direct a coordinate pair of cursor lines to locate a particular section and/or point of the curve 20 for numeric evaluation and/or processing. The movement of the cursors in each of four directions may correspond directly to the grouping on the control panel 14 of the four buttons.

While it is according to the preferred embodiment of the present invention that the oscilloscope be implemented incorporating a computer having a software program control therein, a part or the entirety of the system may be implemented by hardware which is wired in a fixed arrangement, and/or modularized to become disconnected and expanded to receive additional circuits. Therefor, the present invention is not to be limited except according to the claims which follow.

What is claimed is:

1. An oscilloscope receiving a signal to be displayed including:
   parameter control and processing means for receiving said signal to selectively adjust a parameter of said signal, said parameter control and processing means including up/down value slewing means and corresponding up/down value slewing switch means coupled thereto having no value criteria immediately thereat, and parameter select means connected to said parameter control means to select at least one parameter from a plurality of signal parameter adjustments, said parameter select means including at least one parameter selection switch means coupled to said parameter select means such that a parameter may be selected by said parameter selection switch means and such that its value may be altered by said up/down slewing switch means;
   display means receiving the output of said parameter control and processing means to provide a visual representation thereof; and,
   a control panel connected to said parameter control and processing means, said control panel located adjacent to said display means and including said value slewing and parameter selection switch means mounted thereon;
   said parameter select means being controllable from said control panel by said parameter selection switch means, whereby the signal and processing parameter magnitudes are adjusted by said up/down value slewing switch means on said control panel, with the magnitude of the selected parameter being correspondingly indicated on said display means;
   said parameter control and processing means also providing parameter identification signals to said display means so as to generate a corresponding parameter identification image adjacent the displayed magnitude, such that the result of the action taken by said up/down slewing switch means is ascertainable despite the lack of value indication at the up/down slewing switch means.

2. The oscilloscope of claim 1 wherein said identification signals include numeric parameter values.

3. The oscilloscope of claim 1 wherein said identification signals include alpha-numeric parameter labels.

4. The oscilloscope of claim 1 wherein said parameter and processing means includes means for storing a signal and means for storing the signal provided by said processing means allowing a representation of said signal to be stored therein and subsequently recalled.

5. The oscilloscope of claim 1 wherein said parameter and processing means includes process means providing a process selected by said parameter select means.

6. The oscilloscope of claim 4 or 5 further comprising removable storage means connected to said parameter control means providing at least one stored signal and process.

7. The oscilloscope of claim 6 wherein said removable storage means stores said representations.

8. The oscilloscope of claim 7 wherein said removable storage means stores representations of said identification signals and provides a predetermined representations of identification signals to said parameter and processing control.

9. The oscilloscope of claim 8 wherein said removable storage means further stores signals corresponding to the selected process and the values of the parameters for said selected process.

10. The oscilloscope of claim 1 wherein said switch means include a plurality of pushbuttons.

11. The oscilloscope of claim 10 wherein said pushbuttons are arranged in groups of two to provide an increase or decrease of the magnitude of said selected signal parameter according to which one of the two pushbuttons in each group is selected.

12. The oscilloscope of claim 11 wherein said plurality of pushbuttons comprises a first plurality and a second plurality of pushbuttons grouped to provide a corresponding incremental coarse and a fine control of said selected signal parameters.

13. The oscilloscope of claim 10 wherein said pushbuttons are used to alternately select discrete magnitudes of a parameter.

* * * * *